US006401806B1

United States Patent
Lee et al.

(10) Patent No.: US 6,401,806 B1
(45) Date of Patent: Jun. 11, 2002

(54) HEAT SINK ASSEMBLY

(75) Inventors: Tsung Lung Lee; Chung Tien Lai, both of Taipei (TW); Zili Zhang, Shenzhen (CH)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/821,288

(22) Filed: Mar. 29, 2001

(51) Int. Cl.$^7$ ................................................. F28F 7/00
(52) U.S. Cl. ...................... 165/80.3; 165/121; 165/185; 174/16.3; 361/697; 257/722
(58) Field of Search ............................... 165/121, 80.3, 165/185; 174/15.1, 16.3; 361/695, 697, 710; 257/722

(56) References Cited

U.S. PATENT DOCUMENTS

| | | | | |
|---|---|---|---|---|
| 5,421,402 A | * | 6/1995 | Lin | 165/80.3 |
| 5,452,181 A | * | 9/1995 | Hoover | 361/697 |
| 5,495,392 A | * | 2/1996 | Shen | 165/185 |
| 5,615,998 A | * | 4/1997 | Kodama et al. | 165/80.3 |
| 5,943,209 A | * | 8/1999 | Liu | 361/695 |
| 6,109,340 A | * | 8/2000 | Nakase et al. | 165/80.3 |
| 6,179,046 B1 | * | 1/2001 | Hwang et al. | 165/80.3 |
| 6,301,111 B1 | * | 10/2001 | Katsui | 361/697 |
| 6,311,733 B1 | * | 11/2001 | Lin et al. | 165/80.3 |
| 6,330,905 B1 | * | 12/2001 | Lin et al. | 165/80.3 |

* cited by examiner

*Primary Examiner*—Henry Bennett
*Assistant Examiner*—Terell McKinnon
(74) *Attorney, Agent, or Firm*—Wei Te Chung

(57) ABSTRACT

A heat sink assembly includes a heat sink (40), a fan (30), and a fixing device (10). The fan has a chassis (32), and a hollow cylinder (34) extending upwardly therefrom. The heat sink has a base (42) which defines a pair of grooves (422) in a bottom surface thereof, and a plurality of fins (44) with a transverse slot (442) defined through the fins. The fixing device includes a body (12), and four resilient legs (14) depending from corners of the body. A pair of lips (22) depends from opposite edges of the body. A tab (24) extends inwardly from each lip, for engaging in the slot of the heat sink and thereby preventing the fixing device from moving laterally. A hook (18) is formed at a distal end of each leg, for engaging in the grooves and thereby attaching the fan to the heat sink.

15 Claims, 4 Drawing Sheets

HEAT SINK ASSEMBLY

BACKGROUND OF THE INVENTION

1. Field of the Invention

The present invention relates to a heat sink assembly, and particularly to a heat sink assembly having a fixing device for readily and firmly attaching a fan to a heat sink.

2. Related Art

Developments in today's highly information-intensive society have led to remarkable improvements in performances of electronic devices. During operation of many contemporary electronic devices such as CPUs, large amounts of heat are produced. Such heat must be quickly removed from the electronic device, to prevent the system from becoming unstable or being damaged. Typically, a heat sink together with a fan is attached to an outer surface of the device to facilitate removal of heat therefrom.

Referring to FIG. 4, a conventional means for attaching a fan 300 to a heat sink 100 is by using screws 200. Each screw 200 engages with corresponding threads in fins 102 of the heat sink 100. Because modern CPUs generate large amounts of heat, contemporary heat sinks have fins with large depth-to-width ratios. The fins are relatively thin, which enables them to remove heat more efficiency. But an adverse result is that, during installation of the screws 200, there is increased risk of accidental damage to the fins in the vicinity of the threads. Furthermore, such fins are more pliable, and the screws 200 can loosen over time when the system is subjected to normal operating disturbances such as vibration. Moreover, chips may be torn off the threads of a heat sink while the screws 200 are installed. Such loose chips can migrate to other parts of the computer system during installation or use, where they may cause malfunction or damage.

Examples of convention heat sink assemblies are disclosed in Taiwan Patent Applications Nos. 84207163 and 86216714.

An improved means of securing a fan to a heat sink, which overcomes the above problems, is desired.

BRIEF SUMMARY OF THE INVENTION

Accordingly, an object of the present invention is to provide a heat sink assembly having a fixing device which firmly and reliably attaches a fan to a heat sink.

Another object of the present invention is to provide a heat sink assembly which is readily assembled and disassembled.

To achieve the above-mentioned objects, a heat sink assembly of the present invention comprises a heat sink, a fan and a fixing device. The fan has a chassis, and a hollow cylinder extending upwardly therefrom. The heat sink has a base which defines a pair of grooves in a bottom surface, and a plurality of fins with a transverse slot defined through the fins. The fixing device comprises a body, and four resilient legs depending from corners of the body. A pair of lips depends from opposite edges of the body. A tab extends inwardly from a bottom edge of each lip, for engaging in the slot of the heat sink and thereby preventing the fixing device from moving laterally. A hook is formed at a distal end of each leg, for engaging in the grooves of the heat sink and thereby attaching the fan to the heat sink.

Other objects, advantages and novel features of the present invention will be drawn from the following detailed description of a preferred embodiment of the present invention with the attached drawings, in which:

DESCRIPTION OF THE PREFERRED EMBODIMENT

Figure 1:
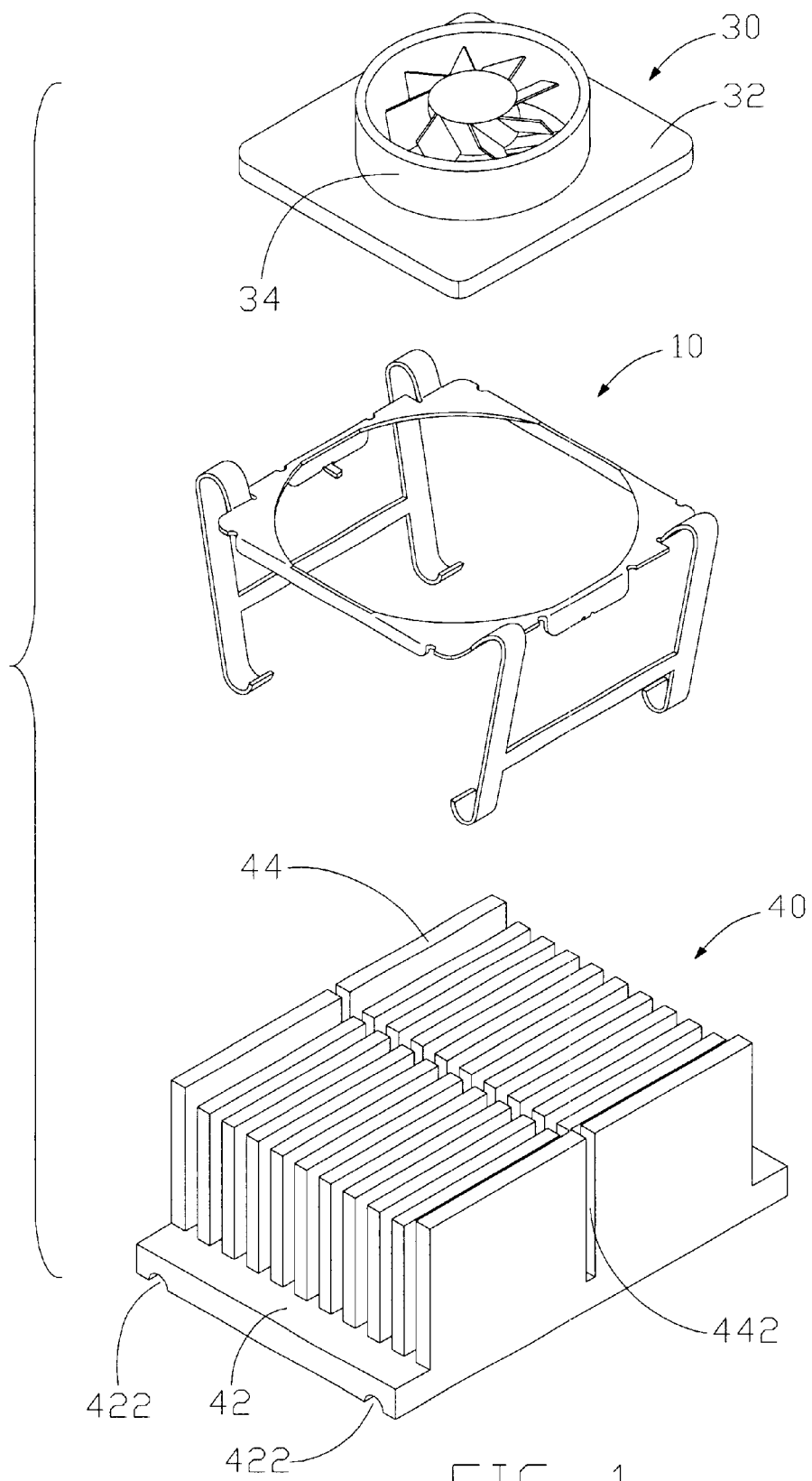
FIG. 1 is an exploded view of a heat sink assembly in accordance with the present invention.

Referring to FIG. 1, a heat sink assembly in accordance with the present invention comprises a fan 30, a heat sink 40, and a fixing device 10 which attaches the fan 30 to the heat sink 40. The fan 30 comprises a rectangular chassis 32, and a hollow cylinder 34 extending upwardly from a middle portion of the chassis 32. A fan blade mechanism (not labeled) is accommodated in the hollow cylinder 34.

The heat sink 40 comprises a base 42 and a plurality of parallel fins 44 extending upwardly therefrom. A pair of grooves 422 is defined in a bottom surface of the base 42 parallel to the fins 44, in the vicinity of each longitudinal edge of the base 42 respectively. Outermost fins 44 extend higher than inner fins 44, thereby defining a receiving space (not labeled) for accommodating the chassis 32 of the fan 30 and correctly positioning the fan 30. A vertical slot 442 is defined through a middle portion of the fins 44, perpendicular to the fins 44.

Figure 2:
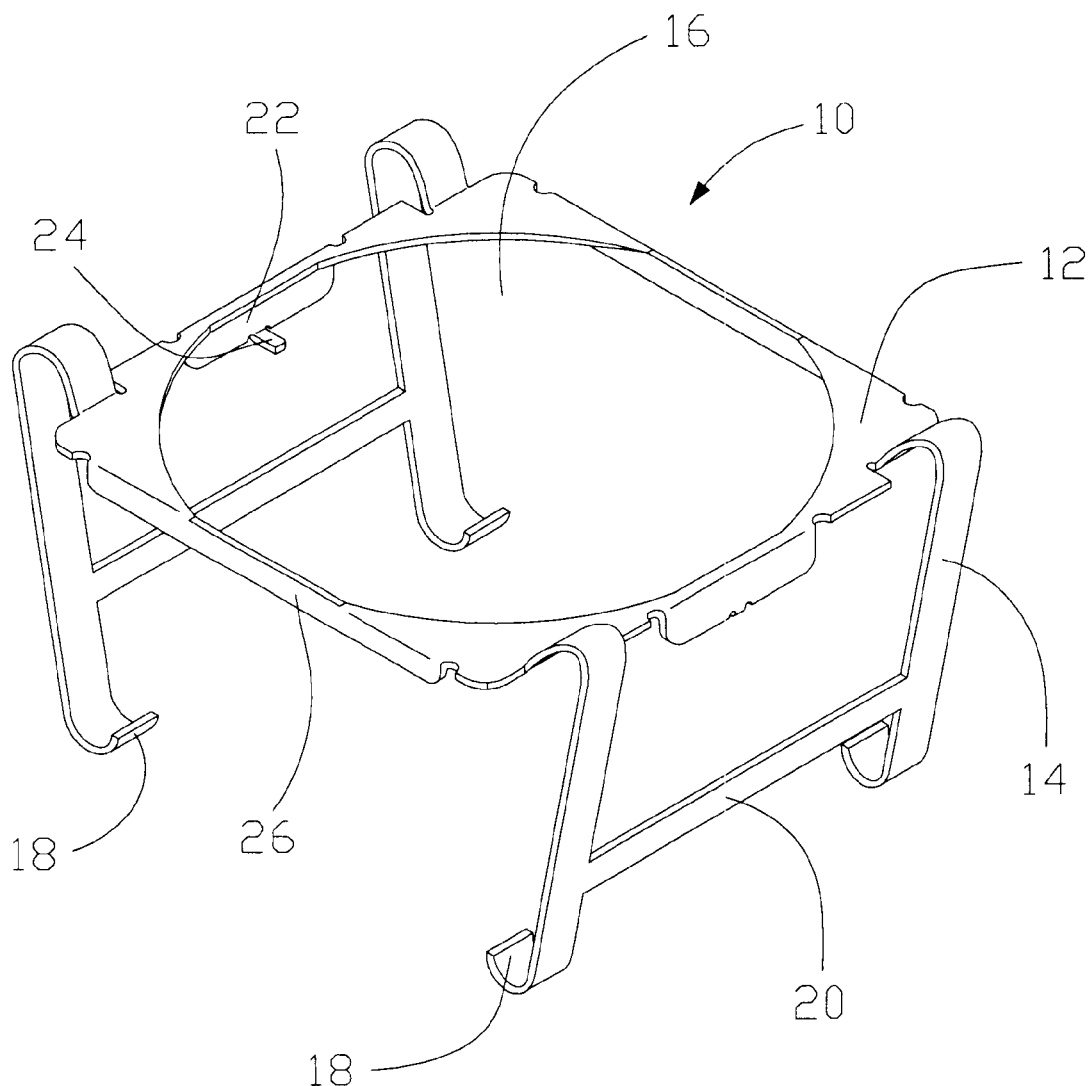
FIG. 2 is a perspective view of a fixing device of the heat sink assembly of FIG. 1.

Referring also to FIG. 2, the fixing device 10 is integrally made from a metal sheet. The fixing device 10 comprises a rectangular body 12, and four resilient legs 14 respectively depending from corners of the body 12. A large opening 16 is defined in a middle portion of the body 12, for extension of the cylinder 32 of the fan 30 therethrough. Each leg 14 extends upwardly and outwardly from the body 12, and then extends downwardly and inwardly. A distal end of each leg 14 is bent upwardly and inwardly to form a hook 18. A reinforcing beam 20 connects each pair of legs 14 which is at a same side of the body 12. A lip 22 depends from an outer side edge of the body 12, between each said pair of legs 14. A tab 24 extends horizontally inwardly from a middle portion of a bottom edge of each lip 22. A pair of flanges 26 respectively depends from opposite sides of the body 12, which opposite sides are between the sides of the body 12 having the legs 14.

Figure 3:
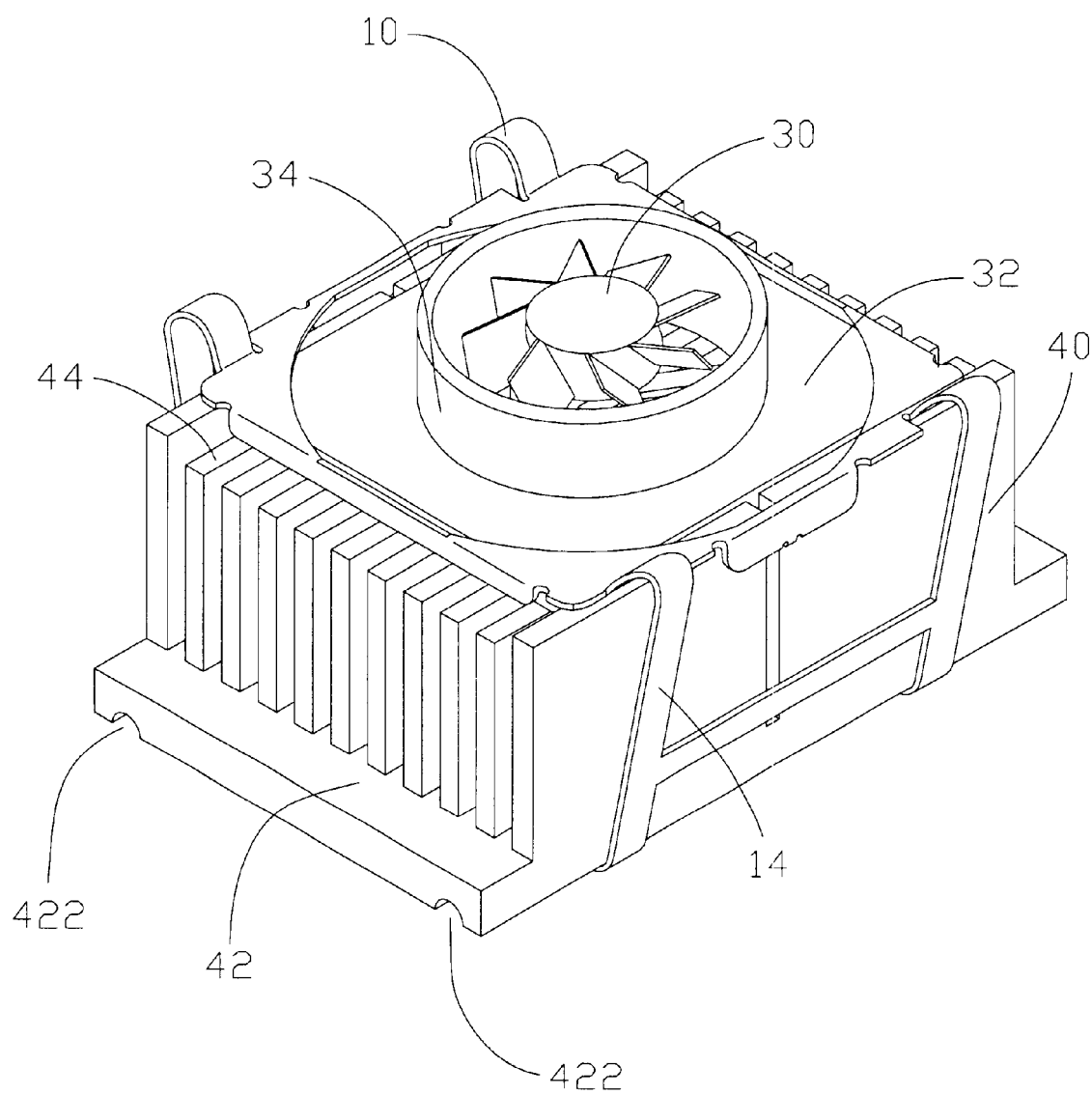
FIG. 3 is an assembled view of FIG. 1.
Figure 4:
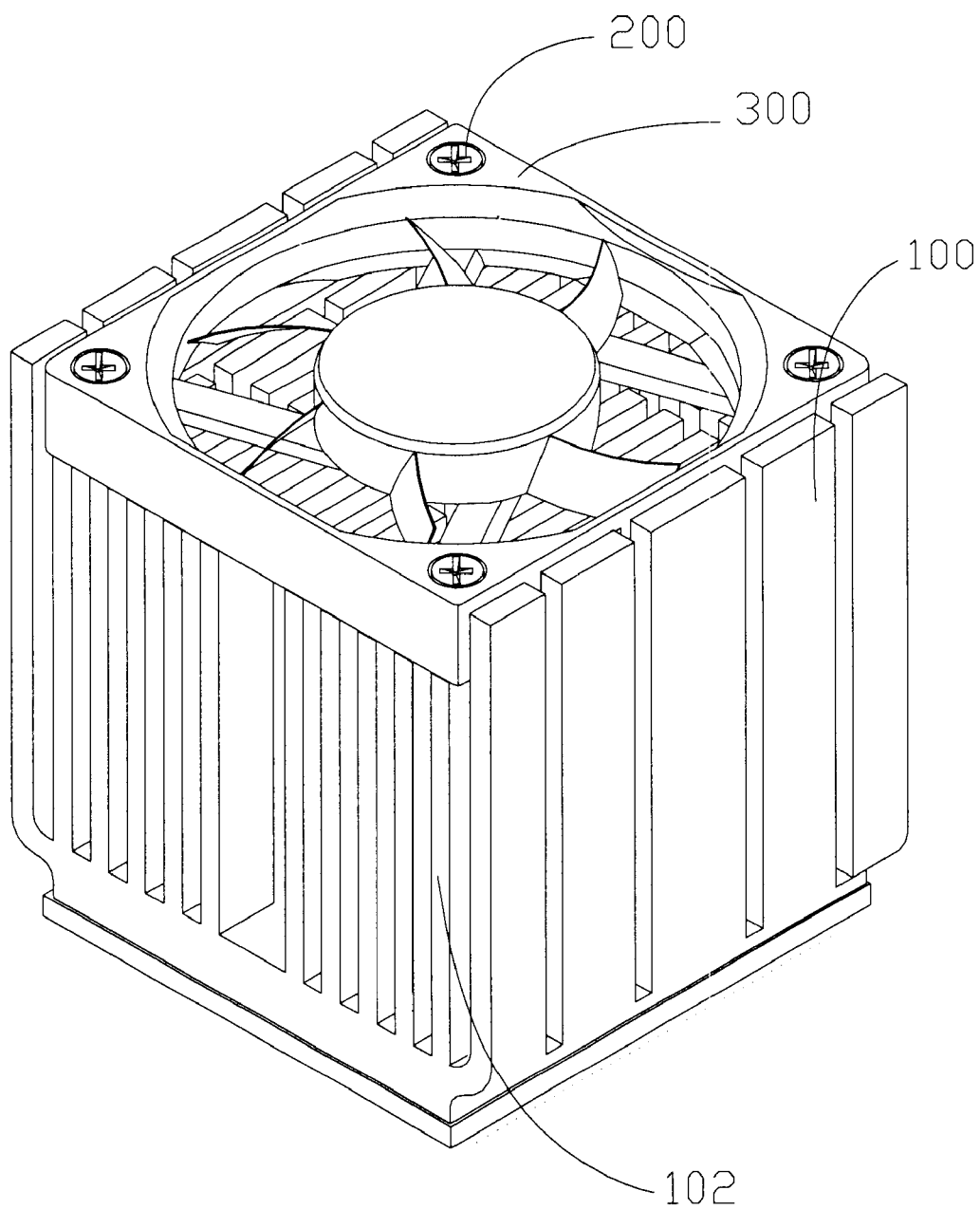
FIG. 4 is a assembled view of a conventional heat sink assembly.

Referring also to FIG. 3, in assembly, the fan 30 is placed onto the heat sink 40, with the chassis 32 of the fan 30 accommodated in the receiving space (not labeled) of the heat sink 40. The fixing device 10 is placed onto the fan 30, with the cylinder 34 of the fan 30 extending through the opening 16 of the fixing device 10. A bottom surface of the body 12 of the fixing device 10 abuts against a top surface of the chassis 32. The hook 18 of each resilient leg 14 engages with the corresponding groove 422 of the heat sink 40, thereby easily attaching the fan 30 to the heat sink 40. The tabs 24 of the fixing device 10 extend into the vertical slot 442 of the heat sink 40, thus preventing the fixing device 10 from moving in directions parallel to the fins 44. The flanges 26 reinforce the fixing device 10 by preventing the body 12 from flexing upwardly.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A heat sink assembly comprising:
a heat sink having a base and a plurality of fins extending from the base, at least one void defined in the base, and a slot defined through the fins;
a fan; and
a fixing device fastening the fan to the heat sink, the fixing device comprising a body and a plurality of resilient legs depending therefrom, the legs having engaging portions for engaging with the corresponding void of the heat sink and thereby attaching the fan to the heat sink, the body having at least one engaging member extending into the slot of the fins of the heat sink for preventing the fixing device from moving laterally.

2. The heat sink assembly as described in claim 1, wherein at least one of the resilient legs of the fixing device extends upwardly and outwardly from the body and then extends downwardly and inwardly, an end of the at least one leg having a corresponding engaging portion.

3. The heat sink assembly as described in claim 1, wherein the fixing device further has at least one reinforcing member connecting two of the legs.

4. The heat sink assembly as described in claim 1, wherein a plurality of lips depends from opposite edges of the body, and wherein at least one corresponding engaging member extends from at least one lip.

5. The heat sink assembly as described in claim 1, wherein a plurality of flanges depends from opposite sides of the body for reinforcing the body.

6. The heat sink assembly as described in claim 1, wherein the fan has a chassis and a hollow member extending upwardly from the chassis for accommodating a fan blade mechanism therein.

7. The heat sink assembly as described in claim 6, wherein an opening is defined in the body of the fixing device for extension of the hollow member of the fan therethrough.

8. A fixing device for attaching a fan to a heat sink, comprising:
a body for pressing the fan against the heat sink, having an opening for extension of the fan therethrough, a pair of lips depending from opposite edges of the body, at least one tab extending from each lip into the heat sink for preventing the fixing device from moving laterally relative to the heat sink; and
a plurality of resilient legs depending from the body in vicinity of corners of the body, respectively, a distal end of each leg having an engaging portion for engaging with the heat sink and thereby attaching the fan to the heat sink.

9. The fixing device as described in claim 8, wherein a plurality of flanges depends from opposite sides of the body, for reinforcing the body.

10. The fixing device as described in claim 8, wherein at least one of the legs is dimensioned to provide resilience.

11. A heat sink assembly, comprising:
a heat sink having a base and a plurality of fins projecting upwardly from the base;
a fan mounted on the fins; and
a fixing device having a body depressing the fan against the fins, a leg depending from the body and engaging with the base, and a tab cooperating with the fan for preventing the fixing device from moving alone a lateral direction of the heat sink.

12. The heat sink assembly as described in claim 11, wherein the leg has a hook at a lower end thereof, said hook fitting into a void defined in the base.

13. The heat sink assembly as described in claim 12, wherein the void is defined in a bottom face of the base.

14. The heat sink assembly as described in claim 13, wherein the body forms a downwardly extending lip, and the tab is horizontally extended from a bottom end of the lip.

15. The heat sink assembly as described in claim 14, wherein the fan comprises a chassis and a fan blade mechanism received in a hollow portion of the chassis, the body depressing the chassis against the fins, the body of the fixing device further defining an opening aligning with the fan blade mechanism.

* * * * *